United States Patent [19]
Abe

[11] Patent Number: 5,646,895
[45] Date of Patent: Jul. 8, 1997

[54] SEMICONDUCTOR MEMORY DEVICE WITH BIT LINE POTENTIAL COMPENSATION CIRCUITS

[75] Inventor: Kazuhiko Abe, Tokyo, Japan

[73] Assignee: NEC Corporation, Tokyo, Japan

[21] Appl. No.: 587,792

[22] Filed: Dec. 26, 1995

[30] Foreign Application Priority Data

Dec. 28, 1994 [JP] Japan ................................. 6-327216

[51] Int. Cl.$^6$ ...................................................... G11C 7/00
[52] U.S. Cl. ...................... 365/189.11; 365/203; 257/903
[58] Field of Search ............................. 365/189.11, 203; 257/903

[56] References Cited

U.S. PATENT DOCUMENTS 5,508,961  4/1996  Han .................................... 365/189.06

Primary Examiner—David C. Nelms
Assistant Examiner—Andrew Q. Tran
Attorney, Agent, or Firm—Sughrue, Mion, Zinn, Macpeak & Seas

[57] ABSTRACT

The semiconductor memory device as static RAM disclosed comprises a memory cell array, a plurality of load circuits, and a plurality of bit line potential compensation circuits. Each of the bit line potential compensation circuits is a pseudo memory cell and is provided between each of the bit line load circuits and the memory cell array for holding the power supply potential supplied. The pseudo memory cell has an element arrangement equivalent to that of each of the memory cells. The pseudo memory cell has a pair of thin film transistors each having a source electrode commonly held at the power supply potential and a drain electrode connected to the gate electrode of the other, the drain electrode of one of the thin film transistors being connected through a third transfer transistor to the first bit line, the drain of the other thin film transistor being connected through a fourth transfer transistor to the second bit line, the gate electrodes of the third and fourth transfer transistors being held at the power supply potential. With this arrangement, it is possible to make a substantial reduction in the element area of the structure.

6 Claims, 9 Drawing Sheets

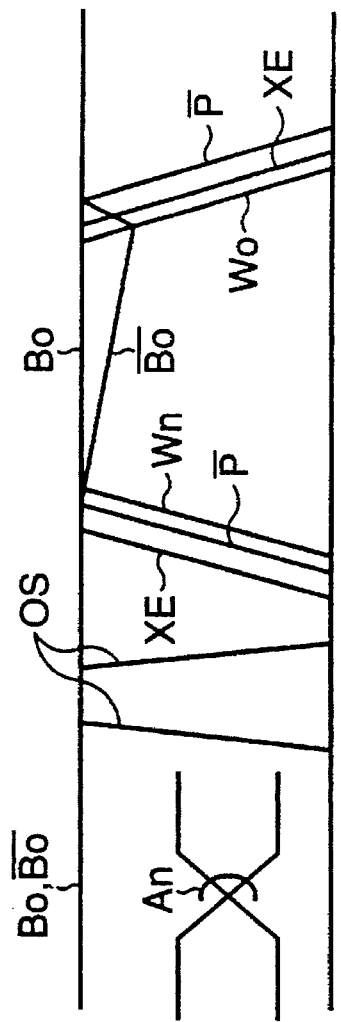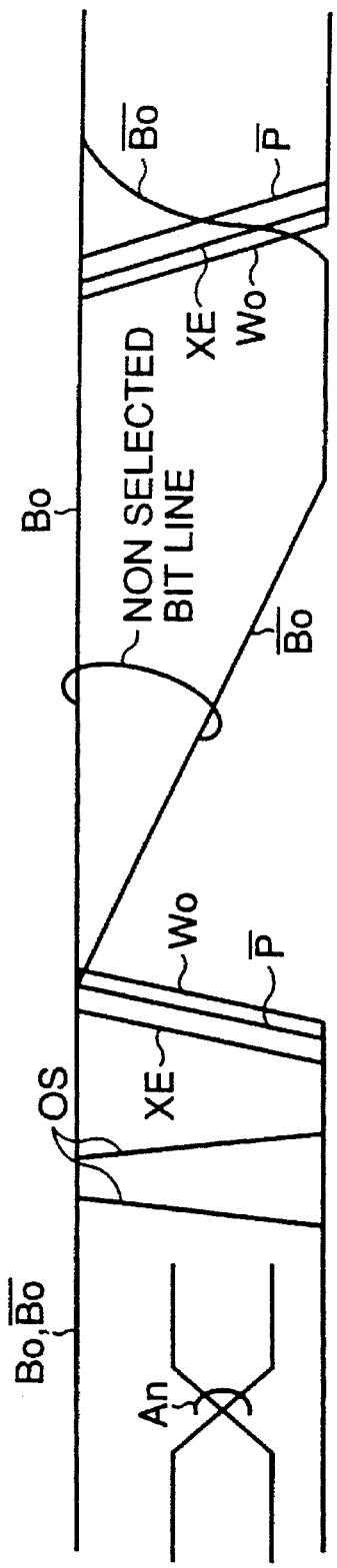

SEMICONDUCTOR MEMORY DEVICE WITH BIT LINE POTENTIAL COMPENSATION CIRCUITS

BACKGROUND OF THE INVENTION

1. Field of the Invention

This invention relates to semiconductor memory devices, and more particularly to low power consumption type semiconductor static RAMs having bit line potential compensation circuits.

2. Description of the Related Art

A conventional low power consumption type semiconductor static RAM of the kind to which the present invention relates is first explained with reference to FIG. 1 showing the circuit structure, FIG. 2 showing the circuit structure of a memory cell shown in FIG. 1, FIG. 3A showing a timing chart in a write operation of the static RAM, and FIG. 3B showing a timing chart in a read operation of the static RAM. The static RAM comprises an address buffer circuit 51, an address transition detection circuit 52, an internal clock generation circuit 53, a row decoder circuit 54, a column decoder circuit 55, a sense amplifier circuit 56, an input/output buffer and output latch circuit 57, a write/read control circuit 58, a write driver circuit 59, bit line load circuits $60_1$ to $60_n$, bit line potential compensation circuits $61_1$ to $61_n$, and a memory cell array 62.

To the address buffer circuit 51, external address input signals $A_0$ to $A_n$ are supplied. Of the outputs of the address buffer circuit 51, upper bits $A_0'$, ... are supplied to the row decoder circuit 54, and lower bits $A_n'$, ... are supplied to the column decoder circuit 55. The upper and lower bits are also supplied to the address transition detection circuit 52.

An output OS of the address transition detection circuit 52 is supplied to the internal clock generation circuit 53. This internal clock generating circuit 53 provides an output XE supplied to the row decoder circuit 54, an output SE supplied to the sense amplifier circuit 56, and an inversion output P (hereinafter referred to as "P*", the asterisk notation (*) being used throughout the disclosure to indicate the inversion or binary complement) supplied to the bit line load circuits $60_1$ to $60_n$.

The write/read control circuit 58 receives a read/write output signal WE*, and provides an output which is supplied to the internal clock generation circuit 53 and also to the write driver circuit 59. The write driver circuit 59 provides an output WCL which is supplied through the input/output buffer and output latch circuit 57 to output I/O terminals, an output WBT supplied through transfer gates $Q_{O5}$, $Q_{O7}$ to $Q_{n5}$, $Q_{n7}$ to bit lines $B_0$ to $B_n$, and an output WBB supplied through transfer gates $Q_{O8}$, $Q_{O6}$ to $Q_{n8}$, $Q_{n6}$ to bit lines $B_0^*$ to $B_n^*$.

The row decoder circuit 54 provides outputs $W_0$ to $W_n$ supplied respectively to word lines of the memory cell array 62. The column decoder circuit 55 provides an output which controls the gate electrode of each of the transfer gates $Q_{O5}$, $Q_{O7}$ to $Q_{n5}$, $Q_{n7}$, and $Q_{O8}$, $Q_{n6}$ to $Q_{n8}$, $Q_{n6}$.

The bit line potential compensation circuits $61_1$ to $61_n$ are inserted between the bit line load circuits $60_1$ to $60_n$ and the memory cell array 62. In the memory cell array 62 to which the bit line potential compensation circuits $61_1$ to $61_n$ are connected, input/output data of memory cells $MC_{00}$ to $MC_{n0}$ are supplied to the bit line $B_0$ and the bit line $B_0^*$, and input/output data of memory cells $MC_{0n}$ to $MC_{nn}$ are supplied to the bit line $B_n$ and the bit line $B_n^*$.

In the semiconductor static RAM as described above, it is attempted to reduce the current to flow from the bit line load circuits $60_1$ to $60_n$ to selected memory cells and also the current to be consumed in the sense amplifier circuit 56.

First, when reading data, the address transition detection circuit 52 detects a change in the external address input signal $A_n$ and outputs a pulse signal OS. The internal clock generation circuit 53 that receives the signal OS outputs a bit line load control signal P*, a word line control signal XE and a sense amplifier control signal SE, these signals being pulse signals having pulse width necessary for the read operation. The signals XE and P* restrict the active period of the word line W and the active period of the sense amplifier circuit 56 to their pulse durations. In this way, the active period of the word line W is made short and constant irrespective of the read cycle time.

Now, the bit line load circuit $60_1$ and the memory cell $MC_{00}$ are considered as an example. The current which flows from the bit line load circuit $60_1$ to the selected memory cell $MC_{00}$ is restricted. A pair of P-channel MOS transistors $Q_{01}$ and $Q_{02}$ of the bit line load circuit $60_1$ are controlled by the pulse signal P* which is synchronized to the word line control signal XE, whereby the bit line load circuit $60_1$ is held "off" while the word line $W_0$ is active. Thus, while the word line $W_0$ is active, current to flow from the bit line $B_0$ and bit line $B_0^*$ into low level nodes of the memory cell $MC_{00}$ corresponds only to the charge that is stored in the line capacitance of the bit line $B_0$ or bit line $B_0^*$.

When writing data, in order to guarantee write data change in the write cycle period and prohibit the operation of the sense amplifier which consumes a large amount of current, the word line $W_0$ is not controlled pulse-wise and, after it is turned active, the bit line load circuit $60_1$ is not turned off until the end of writing of data with an external input signal.

However, as in the read operation, the bit line load circuit $60_1$ is controlled in synchronism to the word line $W_0$, and it is held "off" while the word line $W_0$ is active.

As an example, when writing data of a high level "1" in the memory cell $MC_{00}$, the column decoder circuit 55 selects the bit line $B_0$ and bit line $B_0^*$, and the write driver circuit 59 provides a high level voltage in logic level to the bit line $B_0$ and a low level voltage in logic level to the bit line $B_0^*$. In the active state of the word line $W_0$, the high and low level voltages are written in the nodes N1 and N2 of the memory cell $MC_{00}$ shown in FIG. 2.

However, for example, the memory cell $MC_{0n}$ which is one of the non-selected memory cells other than the memory cell $MC_{00}$ connected to the selected word line $W_0$ outputs data that are held therein to the bit line $B_n$ and bit line $B_n^*$. Assuming that high level data "1" is held at the node N1, the charge stored on the bit line $B_n^*$ connected to the node N2 which is held at low level, flows through a drive transistor $Q_8$ of the memory cell $MC_{0n}$ into the ground potential GND, so that the potential at the bit line $B_n^*$ is eventually reduced from a supply voltage $V_{cc}$ to about the ground potential GND.

Before the word line $W_0$ is turned active, the bit line $B_n$ is held at the supply potential $V_{cc}$. Thus, when the word line $W_0$ is turned active, the node N1 of the non-selected memory cell $MC_{0n}$, holding level data "1", is held at the same potential as before, so that the potential on the bit line $B_0$ is not changed.

In 4 Mbit static RAM class, however, actually 1,024 memory cells are connected to a single bit line, for instance $B_0$. This means that an $N^+$-type diffusion layer (or N-type diffusion layer) forming the source electrodes of transfer transistors $Q_3$ and $Q_4$ having the gate electrodes connected to the word line $W_0$ and the drain electrodes connected to the data storing nodes N1 and N2 in the memory cell $MC_{00}$ for storing data, is connected to the bit line $B_0$ and bit line $B_0^*$ through contact holes for each of 1,024 memory cells.

There is a sub-threshold leakage in the transfer transistor $Q_3$ or $Q_4$ connected to the node N1 or N2 in which the low level data is stored. There is also a junction leakage in the N-type diffusion layer forming the source electrodes. If these leakage currents are greater than the current that is supplied from load transistors $M_5$ and $M_6$ of the memory cell $MC_{00}$, the charge stored at the bit line $B_0$ or bit line $B_n^*$ for which the bit line load circuit $60_1$ is "off" is reduced.

That is, at the non-selected memory cells $MC_{01}$ to $MC_{0n}$ which are connected to the selected word line $W_0$, the potential on the bit line connected to the node N1 or N2 holding high level data is reduced with the lapse of time. Where the write period is as long as 1 msec., for instance, the active period is also about 1 msec., as described before. During this time, the high level potential at the bit line $B_0$ or bit line $B_n^*$ is reduced, and if it becomes lower than the threshold voltage of the drive transistors $Q_5$ and $Q_6$, the data that has been held in that memory cell is destroyed.

The operation of the bit line potential compensation circuit $61_1$, as an example, will now be described. This circuit comprises two P-channel MOS transistors $Q_{03}$ and $Q_{04}$ each having the gate electrode connected to the drain electrode of the other. The P-channel MOS transistors $Q_{03}$ and $Q_{04}$ have their drain electrodes connected to the bit line $B_0$ and bit line $B_0^*$, respectively.

When the P-channel MOS transistor $Q_{03}$ is turned on with reduction of the potential at the bit line $B_0^*$ connected to the node N2 of the memory cell $MC_{00}$ holding low level data from the supply potential $V_{cc}$, a further charge is supplied therefrom to the bit line $B_0$, to which the high level data is supplied from the node N1. This has an effect of preventing the potential level reduction of the bit line $B_0$ due to the leakage.

Further, the potential at the bit line $B_0$ providing high level data is not reduced earlier than the bit line $B_0^*$ providing low level data, so that the P-channel MOS transistor $Q_{04}$ with the drain electrode thereof connected to the bit line $B_0$ is not turned on.

Referring now to FIG. 4, which is a plan view showing the element arrangement of the P-channel MOS transistors $Q_{03}$ and $Q_{04}$ of the bit line potential compensation circuit $61_1$, this circuit $61_1$ has P-type diffusion layers 18 and 19, polycrystalline silicon layers 20 and 21, aluminum interconnects 22 to 26, and contact holes 27 to 34. The aluminum interconnects 23 and 25 constitute the bit line $B_0$, and the aluminum interconnects 22 and 26 constitute the bit line $B_0^*$. The aluminum interconnect 24 is led to the power supply line $V_{cc}$. The P-channel MOS transistor $Q_{03}$ for bit line potential compensation is obtained with the aluminum interconnect 24 of the power supply line $V_{cc}$ connected through the contact hole 32 to the P-type diffusion layer 19 so as to form the source electrode, the aluminum interconnect 25 of the bit line $B_0$ connected through the contact hole 33 to the P-type diffusion layer 19 to constitute the drain electrode, the aluminum line 26 of the bit line $B_0^*$ connected through the contact hole 34 to the polycrystalline silicon layer 21, and the polycrystalline silicon layer 21 thus constituting the gate electrode.

Likewise, the P-channel MOS transistor $Q_{04}$ for bit line potential compensation is obtained with the aluminum interconnect 24 of the power supply line $V_{cc}$ connected through the contact hole 29 to the P-type diffusion layer 18 to constitute the source electrode, the aluminum interconnect 22 of the bit line $B_0^*$ connected through the contact hole 28 to the P-type diffusion layer 18 to constitute the drain electrode, and the aluminum interconnect 23 of the bit line $B_0$ connected through the contact hole 27 to the polycrystalline silicon layer 20 so that this layer constitutes the gate electrode. The shaded regions show channel regions of the P-channel MOS transistors $Q_{03}$ and $Q_{04}$ for bit line potential compensation.

The P-channel MOS transistors $Q_{03}$ and $Q_{04}$ for bit line potential compensation are necessary for all bit line pairs. Therefore, they have to be laid out such that they are accommodated in substantially the same width as the width of the arrangement of the bit line $B_0$ and bit line $B_0^*$ extending in parallel in the memory cell. They also have to be laid out in a rectangular shape with the longer sides thereof parallel to the bit line.

In the recent semiconductor static RAM, because the memory cell array is finely formed, one effect of this is that, at the end portion thereof where such memory cell array is arranged, the exposure of the photoresist is subjected to the light interference during the semiconductor fabrication process due to the presence of density differences of the patterns. This results in size differences between the inner portion and the end portion of the layout. Thus, in order to equalize the pattern sizes of the regular memory cells, the pseudo memory cells are arranged in a line for each pair of bit lines at the outermost periphery of the memory cell array on the side at which the bit line load circuit is connected.

In semiconductor static RAMs of 1 Mbit class, high resistivity polysilicon is used for the load elements of memory cells. In 4 Mbit classes and above, thin film transistors of polysilicon, which are load elements, are used for reducing the power consumption without spoiling the data holding property.

Referring now to FIG. 5, which is a plan view showing the structure of a memory cell, for instance, memory cell $MC_{00}$, using the thin film transistors noted above as load elements. As shown, the memory cell comprises N-type diffusion layers 37 and 38 constituting the source electrode and drain electrode regions of N-channel MOS transistors $Q_5$ and $Q_6$, a first polycrystalline silicon layer 39 constituting the gate electrodes of transfer transistors $Q_3$ and $Q_4$ and also a word line, second polycrystalline silicon layers 40 and 41 constituting the gate electrodes of thin film transistors $M_5$ and $M_6$, third polycrystalline silicon layers 42 and 43 constituting the source electrodes, channels and drain electrode regions of the thin film transistors $M_5$ and $M_6$, aluminum interconnects 44 and 45 of bit line $B_0$ and bit line $B_0^*$, first polycrystalline silicon layers 46 and 47 constituting the gate electrodes of drive transistors $Q_5$ and $Q_6$, contact holes 48, 49 and 50 for connecting the N-type diffusion layers 37 and 38 and first polycrystalline silicon layers 46 and 47 to one another, and contact holes 53 and 54 for connecting the third polycrystalline silicon layers 42 and 43 constituting the drain electrodes of the thin film transistors $M_5$ and $M_6$, second polycrystalline silicon layers 40 and 41 constituting the gate electrodes of the thin film transistors $M_5$ and $M_6$, first polycrystalline silicon layers 46 and 47 as lower layers and N-type diffusion layers 37 and 38 to one another, and contact holes 53 and 54 for connecting the bit line aluminum interconnects and N-type diffusion layers to one another.

FIG. 6 also shows the structure of the memory cell shown in FIG. 5, in a sectional view taken along line 6—6 in FIG. 5. In FIG. 6, the numeral 70 represents a silicon substrate, and the numeral 71 represents an element isolation silicon oxide film.

With a recent trend for increasing memory capacity, the semiconductor chip area is increasing to reduce the number of chips that can be obtained by exposure with a single silicon wafer. Naturally, the number of good chips obtainable from a single silicon wafer is reducing.

In the bit line potential compensation transistors noted above, the bit line leakage current is about several pA, and about several nA at the most, whereas sufficient current that is needed is about 100 nA, i.e., about 100 times the leakage current. In addition, recently there is a method of substituting redundant bit lines for defective bit lines that is adopted in redundancy circuit techniques. However, since short-circuiting of a defective bit line to the ground potential GND results in a current passed through the bit line potential compensation transistor, there is no need of designing the current supplied to the compensation transistor to be greater than is necessary.

However, the recent bit line potential compensation transistor is a bulk transistor. In a P-type bulk transistor with a channel length of 1 μm, a channel width of 1 μm and an oxide film thickness of 15 nm, a current of about 100 μA ($V_{gs}$=Vds=5 V) is caused to flow. To reduce this current to about 100 nA, it is necessary to reduce the channel length to 100 μm.

As shown in FIG. 5, however, the bit line potential compensation transistor has to be realized with the same element arrangement length as the distance between the bit line B and bit line B* (inclusive of the bit line width) of memory cell. This means that the channel length direction is parallel to the bit line.

To reduce the compensation current supply capability, therefore, the channel length should be extended by 1,000 μm in the direction parallel to the bit line, which leads to a corresponding chip area increase.

SUMMARY OF THE INVENTION

An object of the invention, therefore, is to overcome the problems existing in the prior art, and to provide a semiconductor memory device, and more particularly a static RAM having memory cells using thin film transistors as load elements, which includes bit line potential compensation circuits having the element arrangements essentially the same as those of the memory cells, thus improving the element interconnection efficiency therein.

According to one aspect of the invention, there is provided a semiconductor memory device as a static RAM comprising:

a plurality of memory cells using thin film transistors as regular memory cells and forming a memory cell array;

a plurality of bit line load circuits connected to the memory cell array; and a plurality of bit line potential compensation circuits using thin film transistors as pseudo memory cells, each of the bit line potential compensation circuits disposed between the memory cell array and the bit line load circuits and the pseudo memory cells having element arrangements equivalent to those of the regular memory cells.

According to another aspect of the invention, in the semiconductor memory device as above, the pseudo memory cell includes a pair of thin film transistors having source electrodes commonly held at the power supply potential, drain electrodes connected respectively to gate electrodes of the other, a drain electrode of one of them coupled to a first bit line, and a drain electrode of the other coupled to a second bit line.

According to still another aspect of the invention, there is provided a semiconductor memory device comprising:

a memory cell array including a predetermined number of memory cells connected by interconnects, each thereof having a first thin film transistor and a first drive transistor, the transistors being serially inserted between a power supply potential and a ground potential, a second thin film transistor and a second drive transistor, the transistors being serially inserted between the power supply potential and the ground potential, the gates of each set of the first drive transistor and the thin film transistor and of the second drive transistor and the second thin film transistor being commonly connected to a series connection point of the other, the common connection point of the first-mentioned transistor set being connected through a first transfer transistor to a first bit line, the common connection point of the other transistor set being connected through a second transfer transistor to a second bit line;

a plurality of load circuits for supplying the power supply potential to the first and second bit lines; and a plurality of bit line potential compensation circuits each provided between each of the bit line load circuits and the memory cell array for holding the power supply potential supplied, the bit line potential compensation circuits each being a pseudo memory cell connected between the first and second bit lines and the bit line load circuit and being configured such that the pseudo memory cell having an element arrangement equivalent to that of the memory cells.

In the memory device according to the invention, the bit line potential compensation circuits are pseudo memory cells whose element arrangements are equivalent to those of the regular memory cells.

BRIEF DESCRIPTION OF THE DRAWINGS

The above and other objects, features and advantages of the present invention will be apparent from the following description of preferred embodiments of the invention explained with reference to the accompanying drawings, in which:

FIG. 3A is a timing chart for use in explaining a read operation, and FIG. 3B is the same for use in explaining a write operation;

PREFERRED EMBODIMENTS OF THE INVENTION

Now, preferred embodiments of the invention will now be described with reference to the drawings.

Throughout the following explanation, similar reference symbols or numerals refer to the same or similar elements in all figures of the drawings.

Figure 7:
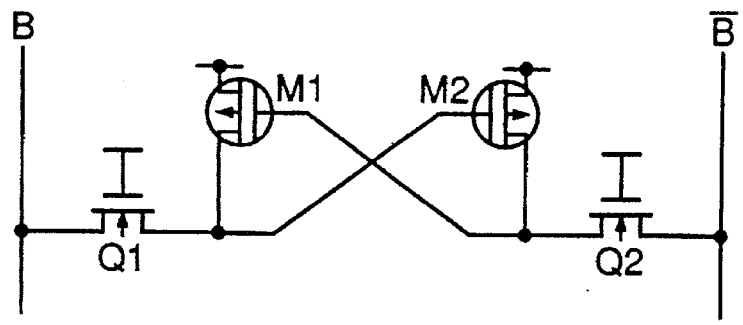
FIG. 7 is an equivalent circuit diagram showing a bit line potential compensation circuit in a first embodiment of the invention.
Figure 8:
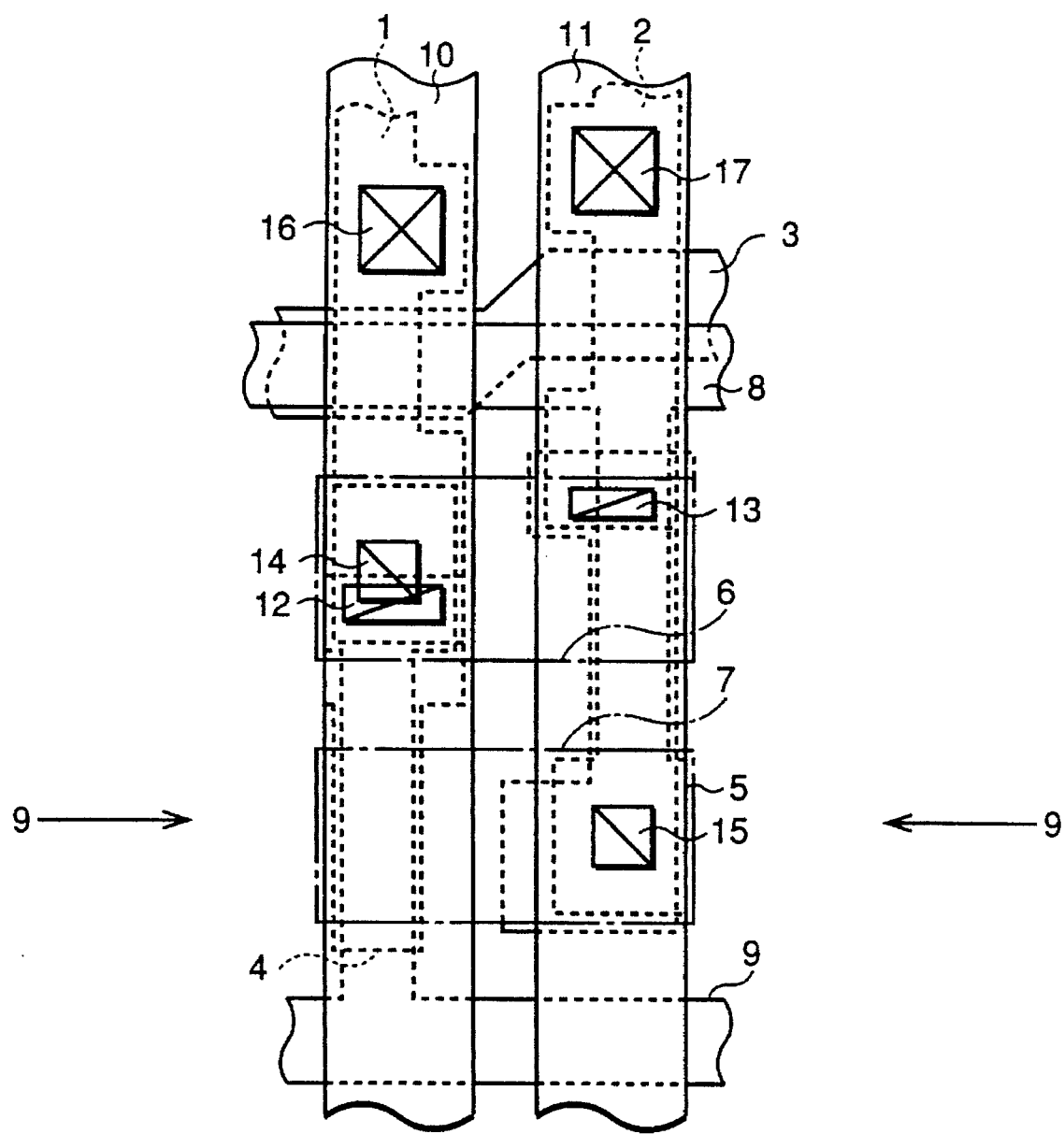
FIG. 8 is a plan view showing an element arrangement in the first embodiment of the invention.
Figure 9:
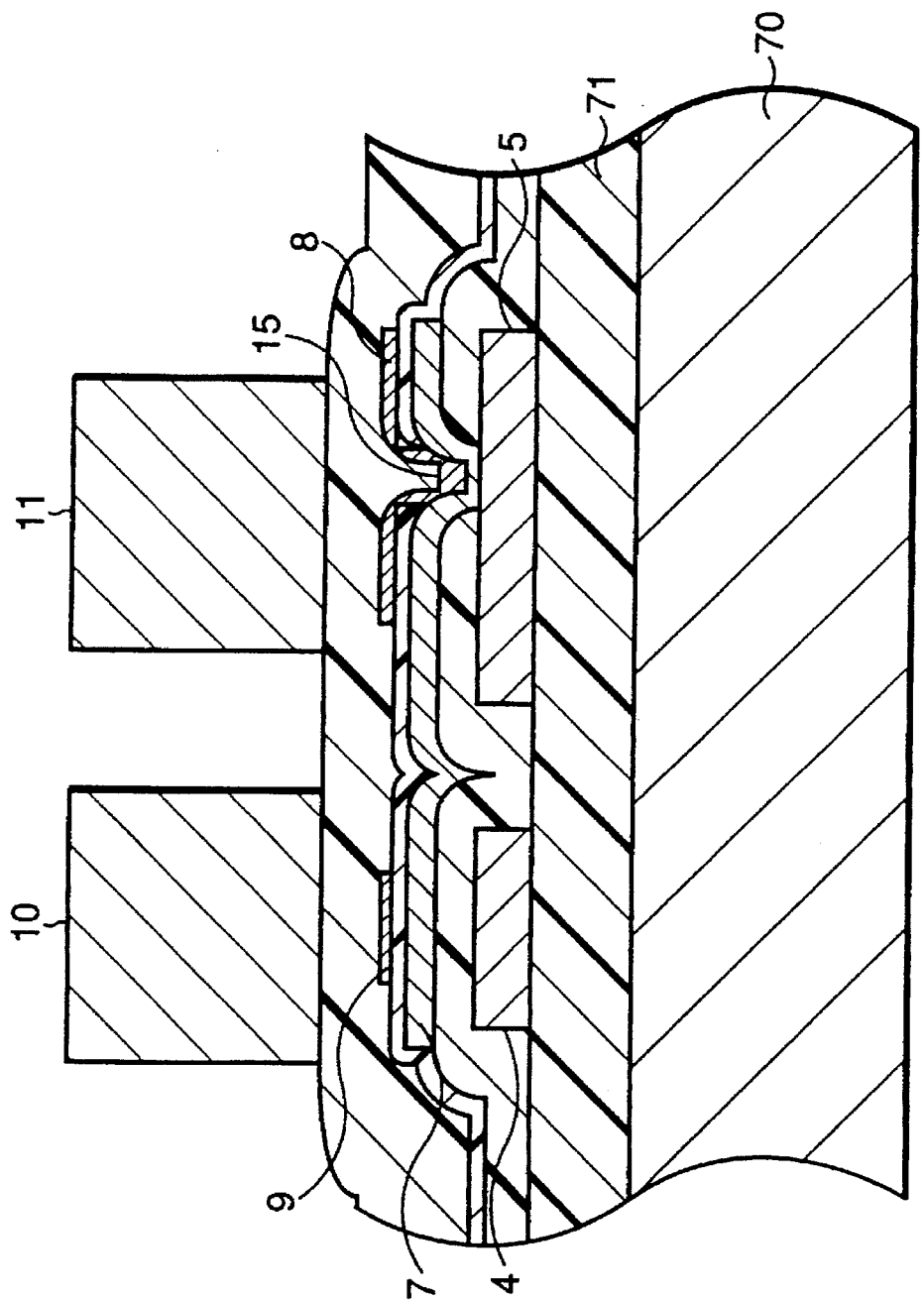
FIG. 9 is a sectional view showing the memory cell shown in FIG. 8, the view taken along line 9—9 in FIG. 8.

FIG. 7 is an equivalent circuit diagram showing a bit line potential compensation circuit in a first embodiment of the invention, and FIG. 8 is a plan view showing the element arrangement of the same circuit. FIG. 9 shows the same circuit in a sectional view taken along line 9—9 in FIG. 8. As shown, the bit line potential compensation circuit has a pair of thin film transistors $M_1$ and $M_2$ each having the source electrode commonly held at power supply potential and the drain electrode connected to the gate electrode of the other. One of these thin film transistors has the drain electrode connected through a transfer transistor $Q_1$ to a first bit line, i.e., bit line B, and the other thin film transistor has the drain electrode connected through a transfer transistor $Q_2$ to a second bit line, i.e., bit line B*. The gates of the transfer transistors $Q_1$ and $Q_2$ are held at the power supply potential $V_{cc}$.

In FIG. 9, the numeral 70 represents a silicon substrate, and the numeral 71 represents an element isolation silicon oxide film on which first polycrystalline silicon layers 4 and 5 are formed.

This bit line potential compensation circuit is different from the prior art one as described in that it includes the transfer transistors $Q_1$ and $Q_2$ which are provided as additional elements. The transfer transistors Q1 and Q2 have their gate electrodes always held at the power supply potential $V_{cc}$, that is, they are always "on", so that the operation of the circuit as a whole is the same as in the prior art.

This circuit features that it utilizes the memory cell circuit, and it has an element arrangement to be described later, which can be matched to the element arrangement of the memory cell.

FIG. 8 shows the element arrangement of the structure in its plan view, and FIG. 9 shows the same in a sectional view taken along line 9—9 in FIG. 8. As in the FIG. 2 prior art memory cell which uses thin film transistors as described before, the structure of this embodiment uses thin film transistors for the bit line potential compensation circuit. The element arrangement illustrated comprises an N-type diffusion layer 1 constituting the source and drain electrodes of the transfer transistor $M_5$, which is an N-channel MOS transistor, an N-channel diffusion layer 2 constituting the source and drain electrodes of the transfer transistor $M_6$, a first polycrystalline silicon layer 3 constituting word lines $W_0$ to $W_n$ and the gate electrodes of the transfer transistors $Q_1$ and $Q_2$, a first polycrystalline silicon layer 4 constituting the gate electrode of the drive transistor $Q_5$ (shown in FIG. 2), a first polycrystalline silicon layer 5 constituting the gate electrode of the drive transistor $Q_6$, a second polycrystalline silicon layer 7 constituting the gate electrode of the bit line potential compensation transistor $M_1$, a second polycrystalline silicon layer 6 constituting the gate electrode of the bit line potential compensation transistor $M_2$, a third polycrystalline silicon layer 9 constituting the source electrode, channel and drain electrode regions of the bit line potential compensation transistor $M_1$, a third polycrystalline silicon layer 8 constituting the source electrode, channel and drain electrode regions of the bit line potential compensation transistor $M_2$, an aluminum interconnect 10 constituting the bit line B, an aluminum interconnect 11 constituting the bit line B*, a contact hole 12 connecting the first polycrystalline silicon layer 2 and the N-type diffusion layer 5 to each other, a contact hole 13 connecting the first polycrystalline silicon layer 2 and the N-type diffusion layer 5 to each other, a contact hole 14 connecting the third and second polycrystalline silicon layers 3 and 6 to the first polycrystalline silicon layer 4 and N-type diffusion layer 1, a contact hole 15 connecting the third polycrystalline silicon layer 7 and the second polycrystalline silicon layer 8 to the first polycrystalline silicon layer 5, a contact hole 16 connecting the aluminum interconnect 10 constituting the bit line B and the N-type diffusion layer 1, and a contact hole 17 connecting the aluminum interconnect 11 constituting the bit line B* and the N-type diffusion layer 2.

As shown, this element arrangement is different from the prior art one in that, of the N-type diffusion layer 1 constituting the source and drain electrodes of the transfer transistors $Q_1$ and $Q_2$ and the source and drain electrodes of the drive transistors $Q_5$ and $Q_6$ in the regular memory cell, the N-type diffusion layer 1 constituting the source and drain electrodes of the drive transistors $Q_5$ and $Q_6$ is not formed, that is, the arrangement does not incorporate the contact hole 50 connecting for the N-type diffusion layer 1 and first polycrystalline silicon layer 47.

As described above, since the gate electrode 3 is held at the power supply potential $V_{cc}$, the N-channel MOS transistors $Q_1$ and $Q_2$ are always "on". The transistors $Q_1$ and $Q_2$ are N-channel MOS transistors, and the bit line high level potential is lower than the power supply potential $V_{cc}$ to an extent corresponding to the threshold voltage of the transistors $Q_1$ and $Q_2$ and also to the substrate bias effect.

As an example, with $V_{cc}$ of 5 V, threshold voltage of 0.7 V and substrate bias effect of 0.3 V, the bit line high level potential is 4 V, and in this case the memory cell data is not destroyed.

Figure 1:
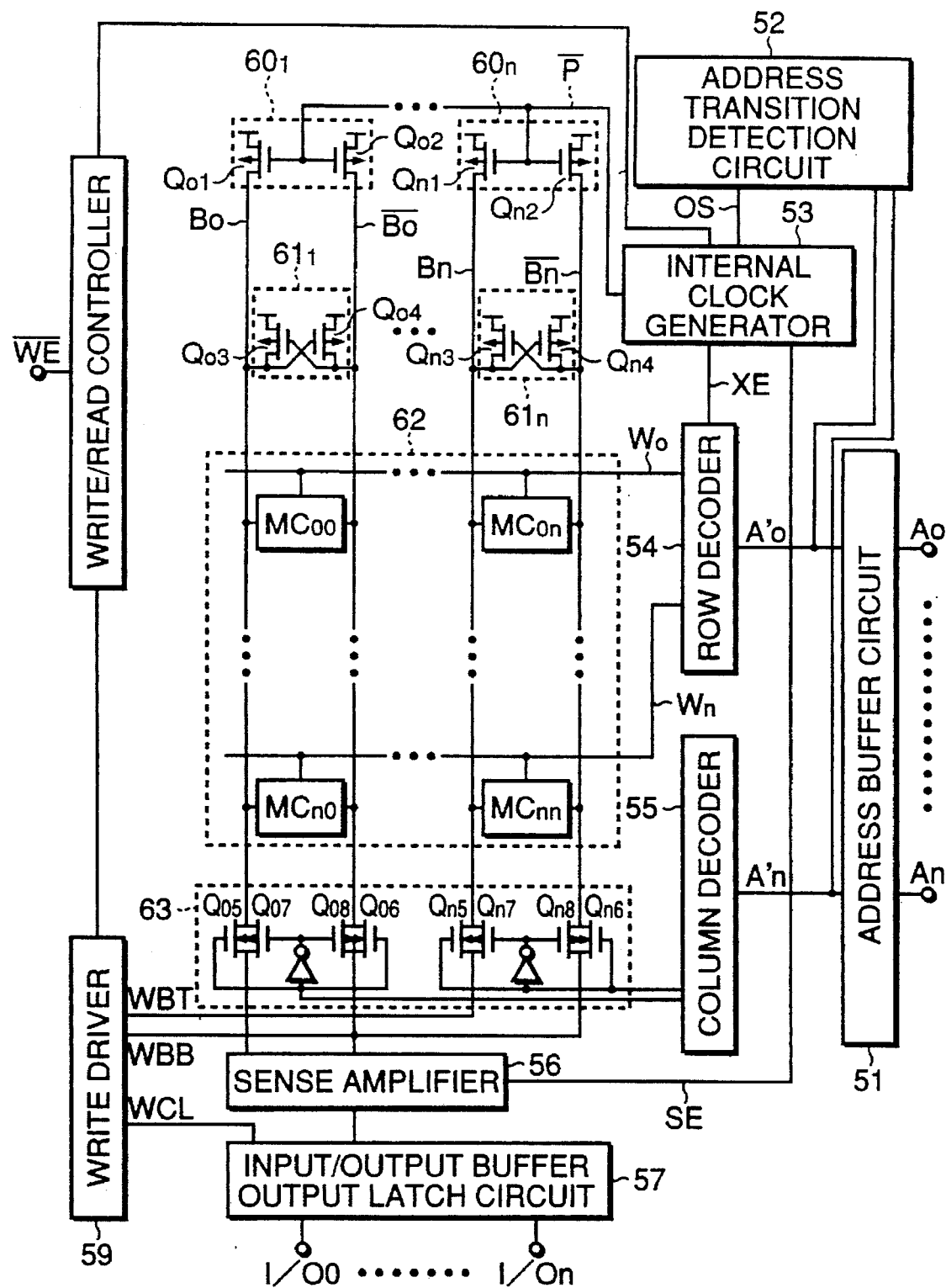
FIG. 1 is a circuit diagram, partially in a block diagram, showing a circuit structure of a conventional semiconductor static RAM.
Figure 2:
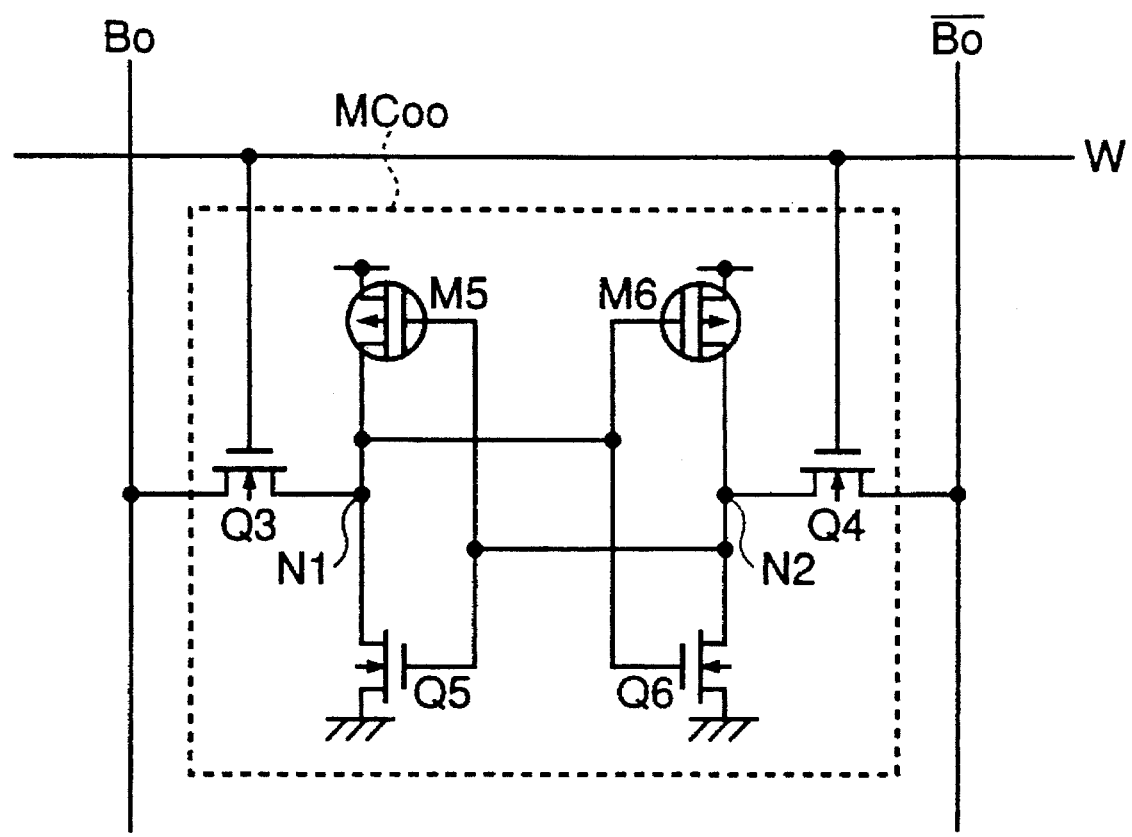
FIG. 2 is a circuit diagram showing a memory cell used in the conventional semiconductor static RAM shown in FIG. 1.
Figure 4:
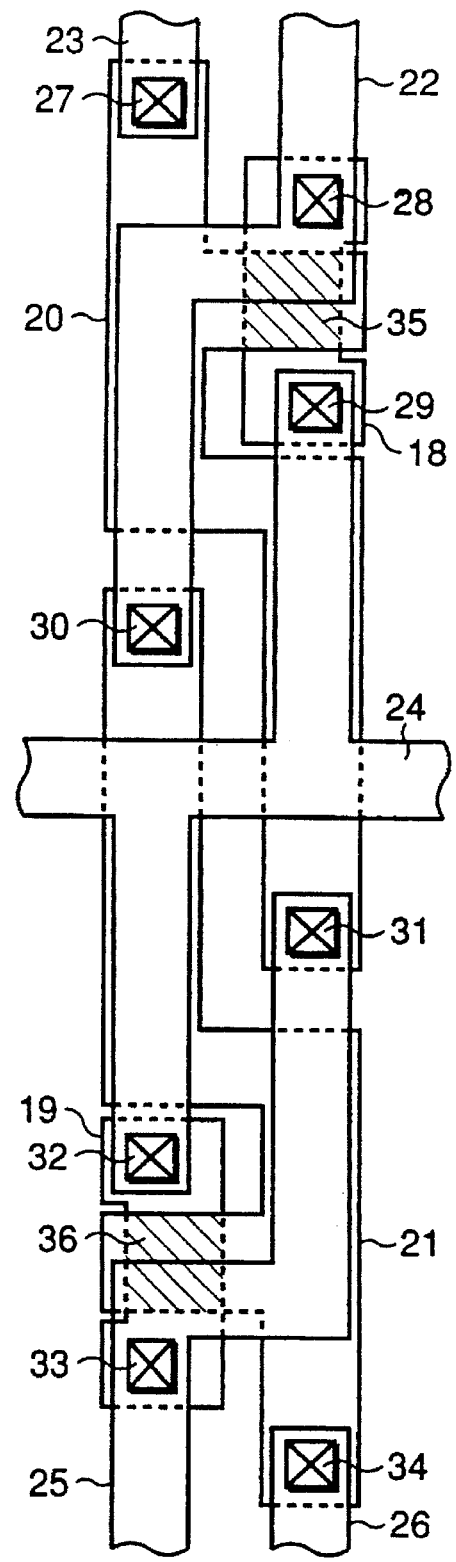
FIG. 4 is a plan view showing an element arrangement of a conventional bit line potential compensation circuit.
Figure 5:
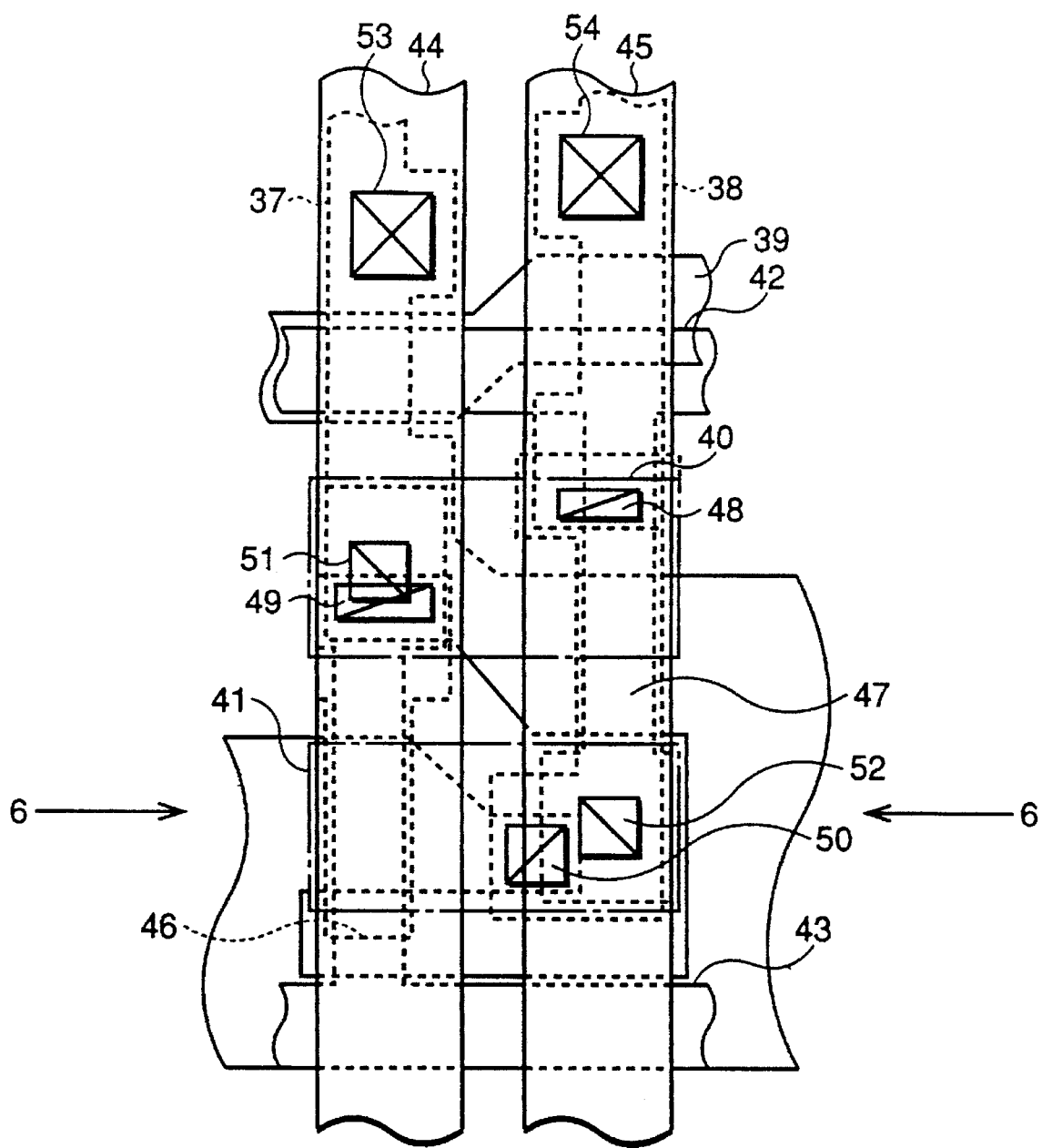
FIG. 5 is a plan view showing an element arrangement of a conventional memory cell shown in FIG. 1.
Figure 6:
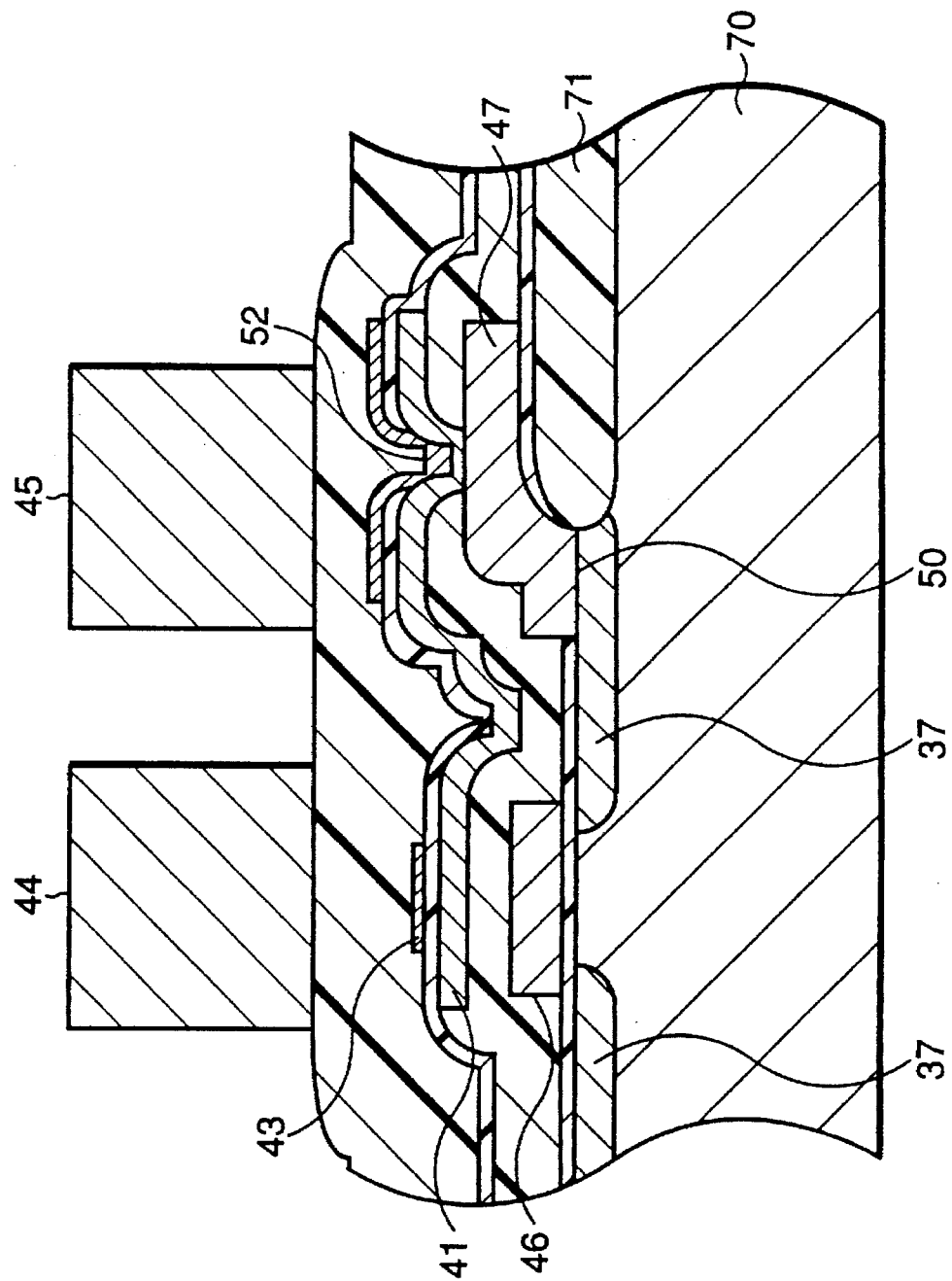
FIG. 6 is a sectional view showing the structure of the memory cell shown in FIG. 5, the view taken along line 6—6 in FIG. 5.

The regular memory cell shown in FIGS. 2 and 5 is constituted by a flip-flop as a combination of the P-channel thin film transistors $M_5$ and $M_6$ and N-channel MOS transistors $Q_5$ and $Q_6$, whereas the related structure in this embodiment is constituted by the sole bit line compensation P-channel thin film transistor pair by eliminating the transistor operation of the N-channel MOS transistors $Q_5$ and $Q_6$ as drive transistors.

The function of the drive transistors $Q_5$ and $Q_6$ is precluded by not forming the N-type diffusion layers 37 and 38 of the source and drain electrode regions of the transistors $Q_5$ and $Q_6$. Instead, the gate electrodes of the first polycrystalline silicon layers 4 and 5 which constitute the gate electrodes of the drive transistors $Q_5$ and $Q_6$ are formed on an element isolation silicon oxide film 71, and this first polycrystalline silicon layers 4 and 5 function as interconnects. This structure permits obtaining a bit line potential compensation circuit having an element arrangement, which has the same element area as the regular memory cell.

The thin film transistors $M_1$ and $M_2$ are disposed adjacent a regular memory cell at the end of the bit line pair, whereby they provide functions of a pseudo memory cell and of a bit line potential compensation circuit.

In the 4 Mbit class, the thin film transistors $M_1$ and $M_2$ carry an "on" current of about 50 nA (with a power supply potential $V_{cc}$ of 5 V), and by providing them at the end of the bit line pair, a bit line potential compensation current of 100 nA can be obtained. In this case, the element area can be reduced to about one half the prior art element area.

Figure 10:
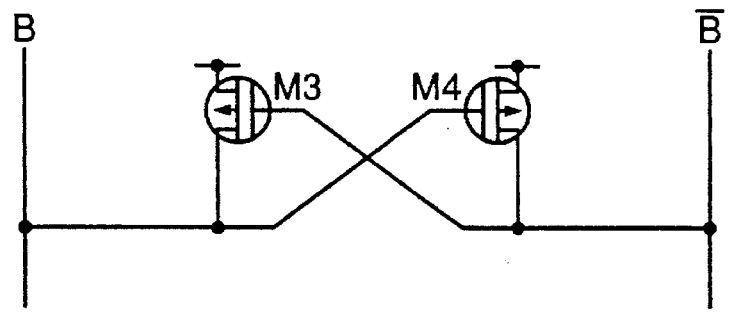
FIG. 10 is an equivalent circuit diagram showing a bit line potential compensation circuit in a second embodiment of the invention.
Figure 11:
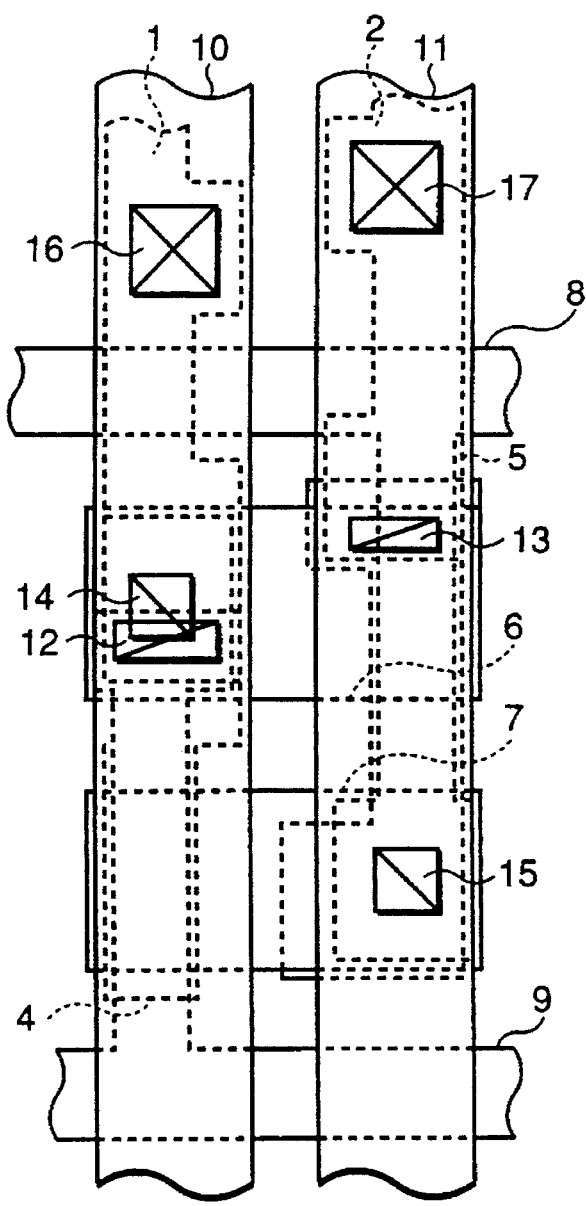
FIG. 11 is a plan view showing an element arrangement in the second embodiment of the invention.

FIG. 10 is an equivalent circuit diagram showing a bit line potential compensation circuit in a second embodiment of the invention, and FIG. 11 is a plan view showing the element arrangement of the circuit. This embodiment is different from the preceding first embodiment in that the transfer transistors $Q_1$ and $Q_2$ are omitted and different from the prior art circuit in that thin film transistors $M_1$ and $M_2$ are used instead of bulk transistors.

Referring to FIG. 11, this embodiment does not have the first polycrystalline silicon layer 3 formed to constitute the gate electrodes of the transfer transistors $Q_1$ and $Q_2$ in the first embodiment. Instead, portions of the channel regions of the gate electrodes of the FIG. 8 transistors $Q_1$ and $Q_2$ constituted by the N-type diffusion layers 1 and 2, are made N-type diffusion layer interconnects.

Again these thin film transistors $M_1$ and $M_2$ can provide the functions of both the pseudo memory cell and the bit line potential compensation circuit by positioning them adjacent to a regular memory cell at the end of the bit line pair. The first embodiment, like the regular memory cell, used the N-channel MOS transistors as the transfer transistors $Q_1$ and $Q_2$. Therefore, it was merely a potential determined by the power supply potential $V_{cc}$ minus transfer transistor threshold voltage $V_{TN}$ minus substrate bias effect $\alpha$, i.e., ($V_{cc}-V_{TN}-\alpha$), that could be compensated for the bit line pair. In contrast, this embodiment does not have the transfer transistors $Q_1$ and $Q_2$, and the disposition of the thin film transistors $M_1$ and $M_2$ at the end of the bit line pair permits compensation of up to the power supply voltage $V_{cc}$. Again in this case, the element area can be reduced to one half or less of the prior art element area.

As has been described in the foregoing, in the semiconductor memory device according to the invention, the bit line potential compensation circuit is constituted by the sole P-channel thin film transistor pair. To this end, use is made of the element arrangement of the regular memory cell, which comprises a flip-flop as a combination of a load transistor, i.e., a P-channel thin film transistor pair, and a drive transistor, i.e., an N-channel MOS transistor pair, and the function of the drive transistor is precluded without forming the N-type diffusion layer that would constitute the source and drain electrode regions of the drive transistor but by forming the first polycrystalline silicon layer constituting the gate electrode of the drive transistor on the element isolation silicon oxide film. The first polycrystalline silicon layer is used as interconnects. With this element arrangement, the thin film transistors can be disposed adjacent a memory cell at the end of the bit line pair to function as a pseudo memory cell and also as a bit line potential compensation circuit having an element arrangement, which has the same element area as the regular memory cell. It is thus possible to reduce the element area to approximately one half compared to the prior art structure using a bulk transistor and provide a semiconductor memory device having an improved element arrangement efficiency.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor memory device as a static RAM comprising:

a plurality of memory cells using thin film transistors as regular memory cells and forming a memory cell array;

a plurality of bit line load circuits connected to said memory cell array; and a plurality of bit line potential compensation circuits using thin film transistors as pseudo memory cells, each of said bit line potential compensation circuits disposed between said memory cell array and said bit line load circuits and said pseudo memory cells having element arrangements equivalent to those of said regular memory cells.

2. The semiconductor memory device according to claim 1, in which said pseudo memory cell includes a pair of thin film transistors having source electrodes commonly held at the power supply potential, drain electrodes connected respectively to gate electrodes of the other, a drain electrode of one of said pair of thin film transistors coupled to a first bit line, and a drain electrode of the other coupled to a second bit line.

3. A semiconductor memory device comprising:

a memory cell array including a predetermined number of memory cells connected by interconnects, each thereof having a first thin film transistor and a first drive transistor, said transistors being serially inserted between a power supply potential and a ground potential, a second thin film transistor and a second drive transistor, said transistors being serially inserted between the power supply potential and the ground potential, the gates of each set of said first drive transistor and said first thin film transistor and of said second drive transistor and said second thin film transistor being commonly connected to a series connection point of the other, the common connection point of the first-mentioned transistor set being connected through a first transfer transistor to a first bit line, the common connection point of the other transistor set being connected through a second transfer transistor to a second bit line;

a plurality of bit line load circuits for supplying the power supply potential to said first and second bit lines; and a plurality of bit line potential compensation circuits each provided between each of said bit line load circuits and said memory cell array for holding the power supply potential supplied, said bit line potential compensation circuits each being a pseudo memory cell connected between said first and second bit lines and said bit line load circuit and being configured such that said pseudo memory cell having an element arrangement equivalent to that of said memory cells.

4. The semiconductor memory device according to claim 3, in which said pseudo memory cell as the bit line potential compensation circuit is constituted by a pair of said thin film transistors each having a source electrode commonly held at the power supply potential and a drain electrode connected to the gate electrode of the other, the drain electrode of one of the thin film transistors being connected through a third transfer transistor to the first bit line, the drain of the other thin film transistor being connected through a fourth transfer transistor to the second bit line, the gate electrodes of said third and fourth transfer transistors being held at the power supply potential.

5. The semiconductor memory device according to claim 3, in which said memory cells each includes a first N-type diffusion layer constituting the source and drain electrode regions of said first transfer transistor and said first and second drive transistors, a second N-type diffusion layer constituting the source and drain electrode regions of said second transfer transistor, a first part of first polycrystalline silicon layer constituting the gate electrode regions of said first and second transfer transistors, a second part of first polycrystalline silicon layer constituting the source and drain electrode regions of said first drive transistor, a third part of first polycrystalline silicon layer constituting the source and drain electrode regions of said second drive transistor, a first part of second polycrystalline silicon layer constituting the gate electrode region of said first thin film transistor, a second part of second polycrystalline silicon layer constituting the gate electrode region of said second thin film transistor, a first part of third polycrystalline silicon layer constituting the source electrode, channel and drain electrode regions of said first thin film transistor, a second part of third polycrystalline silicon layer constituting the source electrode, channel and drain electrode regions of said second thin film transistor, a first aluminum interconnect constituting the first bit line, and a second aluminum interconnect constituting the second bit line, said pseudo memory cells having element arrangements equivalent to those of said memory cells, and being configured such that, of said first N-type diffusion layers, said N-type diffusion layer for the source and drain electrode regions of said first and second drive transistors is not present and said first and second parts of said first polycrystalline silicon layer for gate electrode regions on an element isolation silicon oxide film being occupied by predetermined interconnect regions.

6. The semiconductor memory device according to claim 4, in which said pseudo memory cells have element arrangements equivalent to those of the regular memory cells, and being configured such that said third and fourth transfer transistors are not present and said first and second parts of an N-type diffusion layer for source and drain formation regions of these transfer transistors being occupied by predetermined interconnect regions.

* * * * *